(12) United States Patent
Aman et al.

(10) Patent No.: US 12,075,590 B2
(45) Date of Patent: Aug. 27, 2024

(54) RACK FOR RECEIVING ELECTRONIC DEVICES, IN PARTICULAR MEASURING DEVICES OR SERVERS

(71) Applicant: Rohde & Schwarz GmbH & Co. KG, Munich (DE)

(72) Inventors: Stefan Aman, Munich (DE); Johannes Steffens, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 165 days.

(21) Appl. No.: 17/713,964

(22) Filed: Apr. 5, 2022

(65) Prior Publication Data

US 2023/0320016 A1 Oct. 5, 2023

(51) Int. Cl.
*H05K 7/14* (2006.01)
*H05K 7/20* (2006.01)

(52) U.S. Cl.
CPC ......... *H05K 7/1488* (2013.01); *H05K 7/1489* (2013.01); *H05K 7/20736* (2013.01)

(58) Field of Classification Search
CPC .............. H05K 7/1488; H05K 7/1421; H05K 7/20736; H05K 7/16; H05K 7/1489; A47B 88/48; A47B 88/497; G06F 1/183; G06F 1/187; G06F 1/181; E05Y 2201/694
USPC ............. 211/26; 312/223.1, 223.2, 323, 322; 361/724–727
See application file for complete search history.

(56) References Cited

U.S. PATENT DOCUMENTS

| | | | | |
|---|---|---|---|---|
| 873,225 | A * | 12/1907 | Gehne | A47B 88/497 312/334.3 |
| 921,212 | A * | 5/1909 | Fassett | A47B 88/497 312/334.3 |
| 1,607,441 | A * | 11/1926 | Robert | A47B 88/483 312/334.3 |
| 1,640,664 | A * | 8/1927 | Moore | A47B 88/483 312/334.3 |
| 3,490,603 | A * | 1/1970 | Willer | H05K 7/1417 248/172 |
| 3,759,475 | A * | 9/1973 | Brown | H05K 7/1421 312/273 |
| 4,258,967 | A * | 3/1981 | Boudreau | A47B 88/48 312/273 |
| 4,662,690 | A * | 5/1987 | Genereaux | A47B 88/48 312/274 |
| 5,169,221 | A * | 12/1992 | Wheeler | H05K 7/16 248/299.1 |
| 5,189,597 | A * | 2/1993 | Mayer | H02B 1/36 361/737 |

(Continued)

FOREIGN PATENT DOCUMENTS

| | | |
|---|---|---|
| DE | 29818758 U1 | 9/2000 |
| DE | 20113620 U1 | 1/2002 |

(Continued)

*Primary Examiner* — Hiwot E Tefera
(74) *Attorney, Agent, or Firm* — CHRISTENSEN O'CONNOR JOHNSON KINDNESS PLLC

(57) ABSTRACT

A rack for receiving electronic devices has a plurality of receiving slots. At least one of the receiving slots has a scissor mechanism, the scissor mechanism having a first end connected to the rack and a second end provided with a mounting interface. The mounting interface is adapted for being mechanically connected to an electronic device.

14 Claims, 4 Drawing Sheets

(56) References Cited

U.S. PATENT DOCUMENTS

| | | | | |
|---|---|---|---|---|
| 6,021,047 | A * | 2/2000 | Lopez | H05K 7/1489 312/223.2 |
| 6,215,664 | B1 * | 4/2001 | Hernandez | G06F 1/188 361/732 |
| 6,685,033 | B1 * | 2/2004 | Baddour | G06F 1/183 211/175 |
| 9,769,947 | B1 * | 9/2017 | Sands | H05K 7/1491 |
| 11,369,037 | B1 * | 6/2022 | Xu | G11B 33/142 |
| 2005/0248245 | A1 * | 11/2005 | Ceccarelli | A47B 88/48 312/323 |
| 2007/0019379 | A1 * | 1/2007 | Hsiao | G06F 1/184 361/679.01 |
| 2011/0017563 | A1 * | 1/2011 | Azirian | A47B 3/10 190/11 |
| 2021/0328396 | A1 * | 10/2021 | Crighton | H02B 1/21 |

FOREIGN PATENT DOCUMENTS

| | | | |
|---|---|---|---|
| DE | 102004030269 | A1 | 1/2006 |
| WO | 0189877 | A1 | 11/2001 |

* cited by examiner

RACK FOR RECEIVING ELECTRONIC DEVICES, IN PARTICULAR MEASURING DEVICES OR SERVERS

FIELD OF THE DISCLOSURE

Embodiments of the disclosure relate to a rack for receiving electronic devices such as computers, servers or measuring equipment.

BACKGROUND

The rack typically has a plurality of receiving slots in which the electronic devices are mounted in a stacked manner. As it is desirable to accommodate as many electronic devices as possible within a given space, the electronic devices are mounted with very little space between them one on top of the other.

Often, telescopic slid-out rails are used for mounting the electronic devices in the respective receiving slots. The telescopic slid-out rails allow displacing the electronic devices from an operating position in which they are received in the interior of the rack, to a service position in which they are accessible outside the rack. The telescopic slid-out rails are arranged along the lateral sides of the rack and either engage at the outer sides of the electronic devices or hold a receiving tray on which the respective electronic device is placed. In any case, the telescopic slid-out rails occupy significant space along the sides of the rack in an area which is important for an air flow within the rack with which dissipated heat is discharged from the electronic devices and the rack.

It is therefore desirable to have a system which allows mounting of the electronic devices within a rack without occupying much of the space which is needed for guiding a cooling air flow towards the electronic devices.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

The present disclosure relates to examples of a rack for receiving electronic devices. In an embodiment, the rack includes a plurality of receiving slots. At least one of the receiving slots has a scissor mechanism. In some embodiments, the scissor mechanism has a first end connected to the rack, and a second end provided with a mounting interface. The mounting interface is adapted for being mechanically connected to an electronic device. The scissor mechanism is advantageous, for example, in as it does not occupy as much space as telescopic slid-out rails, thereby leaving more space for the flow of cooling air towards the electronic devices.

In some embodiments, the scissor mechanism may comprise two groups of scissor legs linked to each other, the groups being arranged spaced apart from each other adjacent lateral sides of the rack. Using two groups of scissor legs ensures, for example, that the electronic device is precisely guided within the respective receiving slot.

In some embodiments, the rack may comprise at least one support rail for the scissor mechanism, the support rail extending from a rear end of the rack to a forward end. The support rail significantly increases, for example, the ability of the scissor mechanism to support electronic devices with a high weight.

In some embodiments, the scissor mechanism may have at least one support wheel adapted for rolling on the support rail so that the electronic device can be displaced with low friction between the operating position and the service position outside the rack.

In some embodiments, the support wheel is arranged adjacent the mounting interface so that the scissor mechanism is supported on the support rail in the extended position of the electronic device.

In some embodiments, a guide rail for the scissor mechanism can be arranged at a rear end of the rack, adding to the stability of the mechanism.

In some embodiments, the guide rail may be arranged at a vertical post of the rack which provides for strong mechanical support for the guide rail.

In some embodiments, a damper can be provided for damping a movement of the scissor mechanism when approaching an extended end position, thereby preventing strong mechanical shocks which otherwise could occur when an operator displaces the electronic device towards the extended position without exercising reasonable care.

In some embodiments, a guide structure for the scissor mechanism may be associated with the mounting interface, ensuring, for example, that the electronic device is held in the desired position irrespective of the particular position of the mounting interface.

In some embodiments, the guide structure may include one of a guide slot and a guide rail so that the guiding function can be implemented easily.

In some embodiments, the guide structure may include a curved pivot guide which allows pivoting the mounting interface and thus the electronic device with respect to the scissor mechanism.

In some embodiments, the curved pivot guide merges into the guide slot which extends straight. The guide structure thus provides both for a guiding function when the scissor mechanism is being extended, and when the mounting interface is pivoted with respect to the scissor mechanism.

In some embodiments, a pivot connection may be provided for connecting the mounting interface to the scissor mechanism so that the mounting interface can safely be pivoted with respect to the scissor mechanism.

In some embodiments, a damper may be provided for damping a movement of the mounting interface when it approaches a position of maximum pivot angle, preventing, for example, that high mechanical stress being generated when a position of maximum pivot angle is reached quickly.

In some embodiments, a latching mechanism may be provided which has a latched condition in which a pivoting movement of the mounting interface is prevented, and a released condition in which the mounting interface is free to pivot around the pivot connection. The latching mechanism prevents, for example, any unintentional pivoting of the mounting interface and thus of the electronic device when the electronic device is in the extended position.

In some embodiments, the latching mechanism may have an abutment provided at a vertical post of the rack arranged at a forward side of the rack, and a pivotable latch arranged at a guide structure associated with the mounting interface. The pivotable latch thus automatically cooperates, for example, with the abutment when the electronic device approaches the extended position.

Embodiments of the disclosure further provide a rack for receiving electronic devices, having four vertical posts and a plurality of receiving slots. In an embodiment, at least one of the receiving slots has two guide rails arranged on either side of the rack from a rear post to a forward post, the respective receiving slot having a scissor mechanism. In an embodiment, the scissor mechanism has a first end connected to the rear posts, and a second end provided with a mounting interface adapted for a mechanical connection to a server or a measuring device. In an embodiment, the mounting interface is associated with a guide structure to which a lower termination leg of the scissor mechanism is pivotally connected. The guide structure may further have a guide slot in which an upper termination leg of the scissor mechanism is received. The guide slot may have a vertical slot portion adapted for accommodating a vertical displacement of the upper termination leg occurring when the mounting interface is displaced from a rearward position to a forward position. The guide slot may further have a curved portion whose centre of curvature coincides with the pivot axis defined by the connection between the lower termination leg of the scissor mechanism and the guide structure. A latching mechanism may be provided which prevents the mounting interface from pivoting with respect to the scissor mechanism when in a latched condition. Regarding the advantages of this rack, reference is made to the above comments.

DESCRIPTION OF THE DRAWINGS

The foregoing aspects and many of the attendant advantages of claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
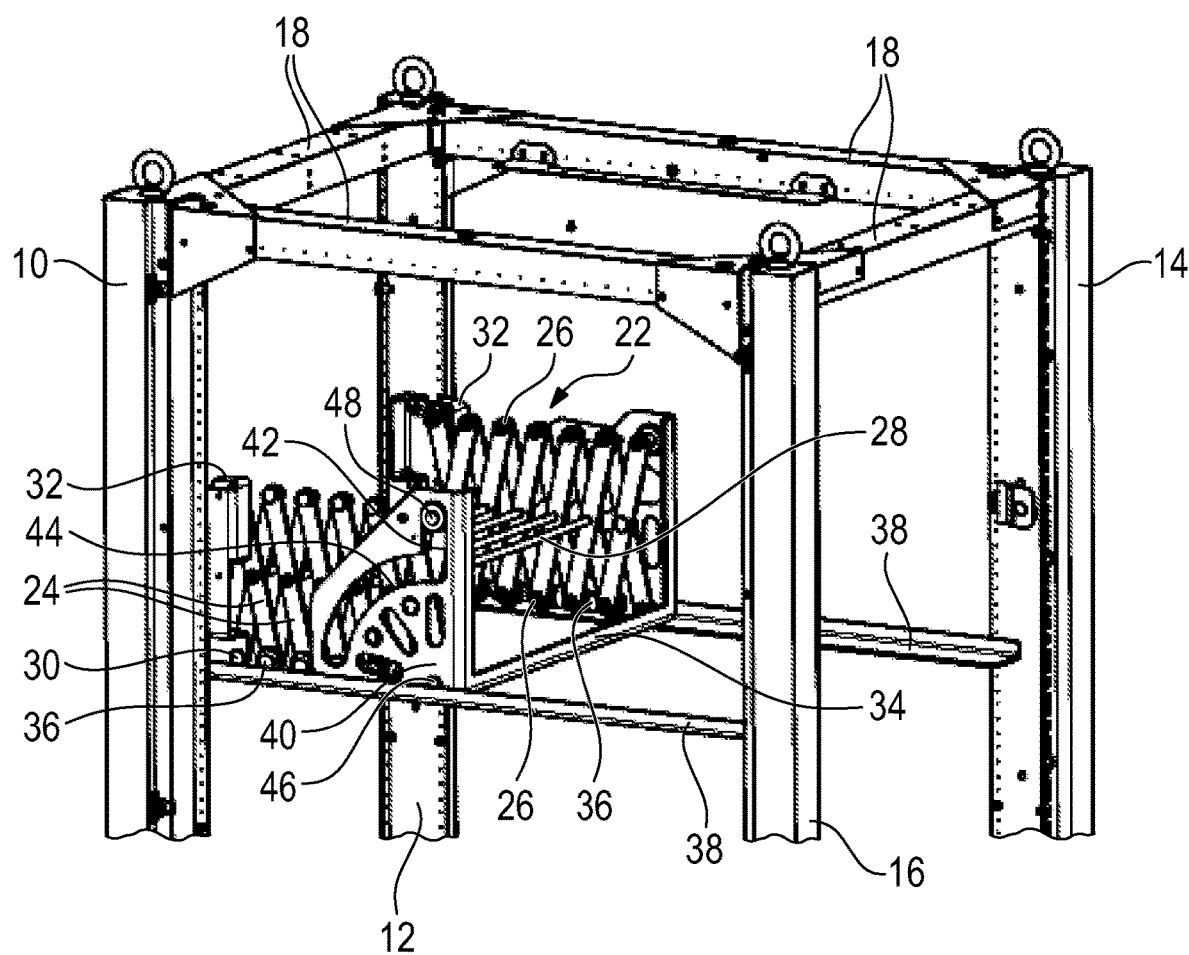
FIG. 1 shows in a perspective view an example of a part of a rack with a receiving slot and a scissor mechanism, the scissor mechanism being shown in a position which corresponds to the operating position of an electronic device received in the receiving slot.

In FIG. 1, the upper portion of a rack for receiving electronic devices is shown. The electronic devices to be received in the rack can be computers, servers or measuring devices, for example. As shown in the embodiment of FIG. 1, four vertical posts 10, 12, 14, 16 are visible. They form the supporting structure of the rack together with horizontally extending beams 18.

The side of the rack defined by posts 10, 12 is hereinafter referred to as being the rear side which is the side where typically connecting cables to the electronic devices are placed. The side defined by posts 14, 16 is hereinafter referred to as the forward side which is the side where the electronic devices are typically accessible. The sides defined by posts 10, 16 and 12, 14 are referred to as being the lateral sides of the rack.

If desired, panels can be mounted at the lateral sides, and a door can be mounted at the forward side so that a rack cabinet is formed.

Figure 2:
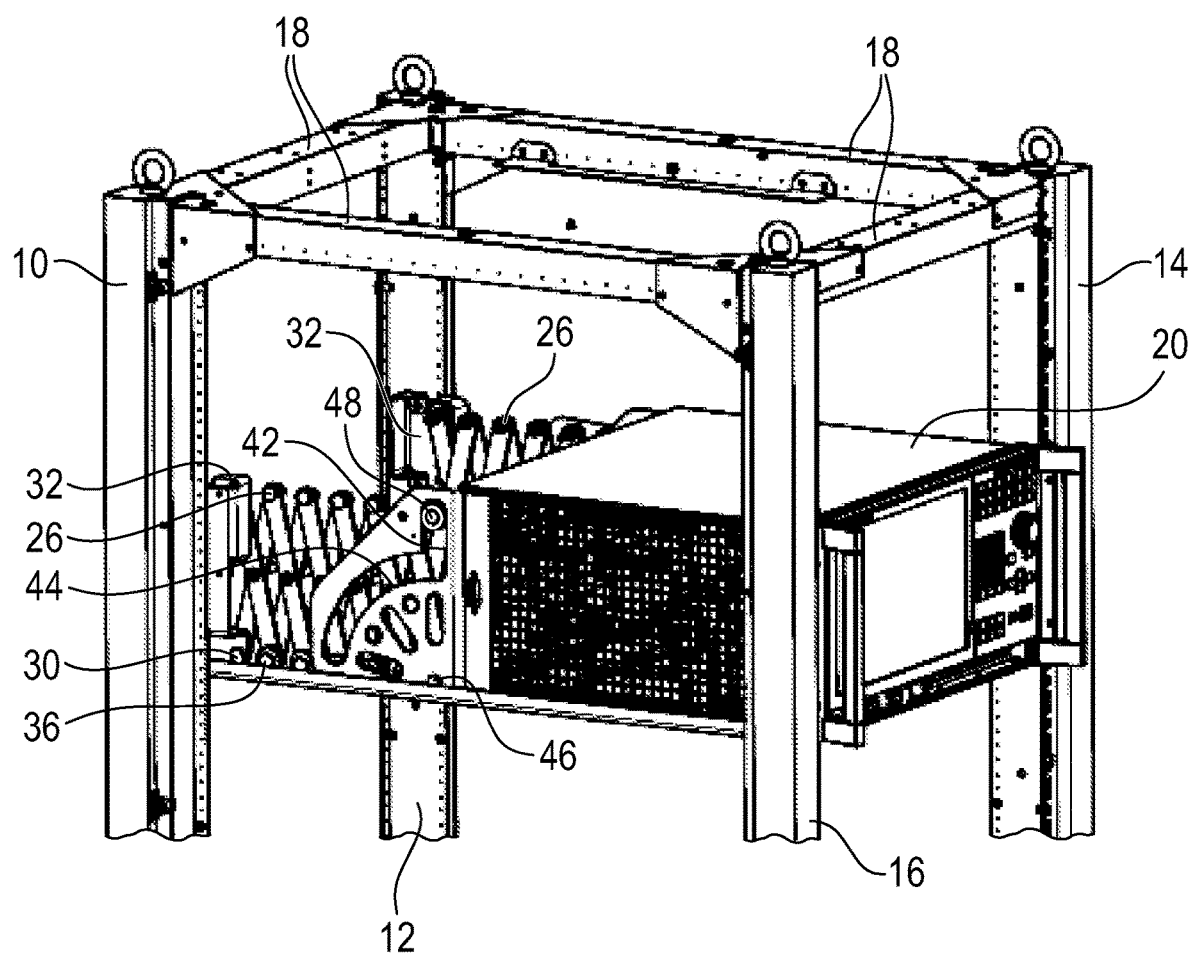
FIG. 2 shows the rack of FIG. 1 with an electronic device received in the receiving slot in the operating position.

Within the rack, a plurality of receiving slots is defined, each receiving slot being adapted for receiving an electronic device. As an example, a measuring device 20 is shown in FIG. 2 received in one of the receiving slots.

Associated with the respective receiving slot is a scissor mechanism 22. In the embodiment shown, the scissor mechanism 22 is composed of two groups of scissor legs 24 which are linked to each other. As can be seen in FIGS. 1 and 2, the groups of scissor legs are arranged adjacent the lateral sides of the rack.

Scissor legs 24 are connected to each other by links 26 which are arranged at the ends of each leg. Connecting rods 26 are arranged between at least some of the legs 24 of the two groups in order to increase the stability. The connecting rods (or an extension to them) can serve as an additional link between crossing legs 24.

The scissor mechanism 22 is connected at one of its ends to the rack, namely at the rear side of the rack. The connection is made, for example, with a connecting link 30 on either side of the scissor mechanism 22. The connecting links 30 are stationary with respect to post 10, 12, and with two guide rails which are also stationary with respect to post 10, 12. Each guide rail 32 receives the upper end at the rear side of the scissor mechanism 22.

The forward end of scissor mechanism 22 is connected to a mounting interface 34. Mounting interface 34 is adapted for being mechanically connected to the electronic device which is to be received in the respective receiving slot. In the embodiment shown, mounting interface 34 is formed from a U-shaped frame element to which the rear side of the respective electronic device can be connected, for example, by fasteners such as screws.

At least some of the lower links 26 of scissor mechanism 22 are provided with a support wheel 36 each, the support wheels 36 being adapted to be displaced along one of two guide rails 38 which extend horizontally between post 10, 16 and 12, 14, respectively, and thus along the lateral sides of the rack.

Mounting interface 34 is connected to scissor mechanism 22 by a guide structure. In the embodiment shown, the guide structure may be formed, for example, from two sheet metal plates 40 connected to the rear side of mounting interface 34. Each sheet metal plate comprises a vertically extending guide slot 42 and a curved pivot guide 44. Pivot guide 44 merges continuously into guide slot 42.

The guide structure formed by sheet metal plates 40 is connected to scissor mechanism 22 by two pivot connections 46 and two guide wheels 48. Pivot links 46 pivotally connect the forward lower end of scissor mechanism 22 to the guide structure. Guide wheels 48 engage into the guide slot 42 and pivot guide 44. Pivot guide 44 has a radius of curvature which coincides with the axis of pivot connections 46.

Figure 3:
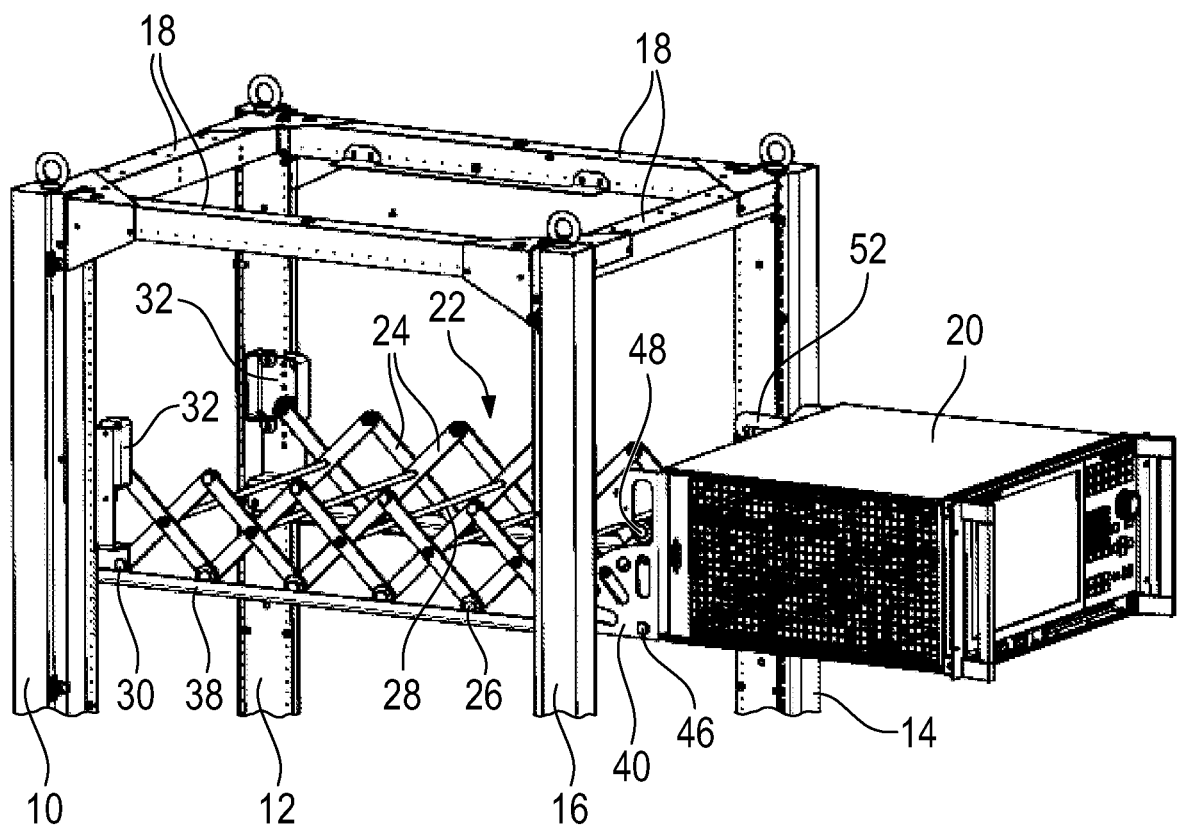
FIG. 3 shows the rack of FIG. 1 with the electronic device in an extended position.
Figure 4:
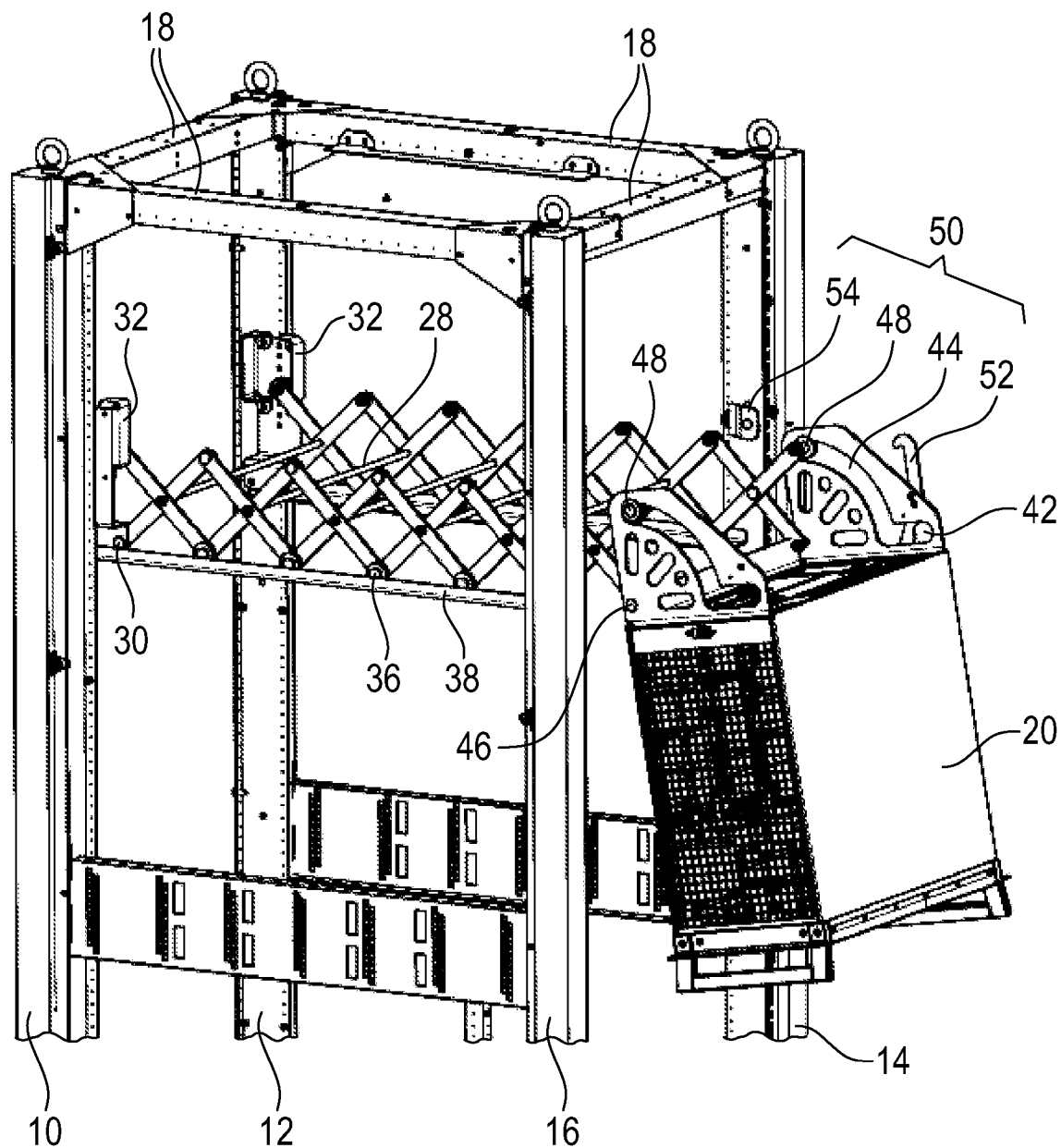
FIG. 4 shows the rack of FIG. 3 with the electronic device in a service position.

Scissor mechanism 22 can be displaced between a folded condition shown in FIG. 1 and an extended condition shown in FIGS. 3 and 4. In the folded condition, the electronic device 20 connected to mounting interface 34 is received within the respective receiving slot (see FIG. 2) and is received within the rack (see FIG. 2).

Scissor mechanism 22 together with guide wheels 48 and guide rails 38 allows for the withdraw of the electronic device 20 from the rack at its forward side (see FIG. 3). In the extended position, scissor mechanism 22 is supported on guide rails 38, and the guide wheels 48 remain received in vertical guide slots 42, thereby preventing mounting interface 34 from pivoting with respect to the orientation defined by scissor mechanism 22 and guide rails 38.

A damper (not shown in the drawings) may be provided for damping the displacement of the mounting interface when it approaches the fully extended position.

In the fully extended position shown in FIG. 3, guide wheel 48 has been displaced downwardly in guide slot 42 to the point where curved pivot guide 44 starts. As long as guide wheel 48 is held in vertical guide slot 42, it is ensured that mounting interface 34 cannot pivot around pivot connection 46. In order to prevent unintentional pivoting of the electronic device 20 in a fully withdrawn condition, a latch mechanism 50 is provided which ensures that mounting interface 34 and electronic device 20 connected hereto can only be pivoted upon intentional release of latching mechanism 50.

In the embodiment shown, the latching mechanism 50 comprises a pivotable latch 52 arranged at one of the guide structures 40 associated with mounting interface 34. Latching mechanism 50 further comprises an abutment 54 which is connected to the respective vertical post 14. In a fully extended condition, pivotable latch 52 engages at abutment 54 so that mounting interface 34 and electronic device 20 are held in the condition shown in FIG. 3. After latch 52 has been pivoted into a release condition so that it disengages from abutment 54, mounting interface 34 can be pivoted around pivot links 46 into the condition shown in FIG. 4. In this condition, the rearward side of electronic device 20 is easily accessible so that cables can be plugged to electronic device 20 or disconnected therefrom. After these steps have been concluded, electronic device 20 is rotated upwardly into the horizontal position and can then be pushed rearwardly back into the rack.

A damper may be arranged at the curved pivot guide 44 at the end which is opposite the guide slot 42. The damper may be, for example, a rubber element or some similar structure which dampens the movement of the guide structure 40 with respect to guide wheels 48 when they are approaching the end of the pivot guide 44.

Scissor mechanism 22 together with support rails 38 occupies very little space laterally of electronic devices 20 so that coolant air can freely circulate within the rack.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A rack for receiving electronic devices, the rack having a plurality of receiving slots, at least one of the receiving slots having a scissor mechanism, the scissor mechanism having a first end connected to the rack and a second end provided with a mounting interface, the mounting interface being adapted for being mechanically connected to an electronic device,
wherein a guide structure for the scissor mechanism is associated with the mounting interface, wherein the guide structure includes a guide slot, and a curved pivot guide, and wherein the curved pivot guide merges into the guide slot which extends straight.

2. The rack of claim 1 wherein the scissor mechanism comprises two groups of scissor legs linked to each other, the groups being arranged spaced apart from each other adjacent lateral sides of the rack.

3. The rack of claim 1 wherein at least one support rail for the scissor mechanism is provided, the support rail extending from a rear end of the rack to a forward end.

4. The rack of claim 3 wherein the scissor mechanism has at least one support wheel adapted for rolling on the support rail.

5. The rack of claim 4 wherein the support wheel is arranged adjacent the mounting interface.

6. The rack of claim 1 wherein at least one guide rail for the scissor mechanism is arranged at a rear end of the rack.

7. The rack of claim 6 wherein rack has at least one vertical post, the guide rail being arranged at the vertical post.

8. The rack of claim 6 wherein a damper is provided for damping a movement of the scissor mechanism when approaching an extended end position.

9. The rack of claim 1 wherein a pivot connection is provided for connecting the mounting interface to the scissor mechanism.

10. The rack of claim 9 wherein a damper is provided for damping a movement of the mounting interface when it approaches a position of maximum pivot angle.

11. A rack for receiving electronic devices, comprising:
a plurality of receiving slots, at least one of the receiving slots having a scissor mechanism, the scissor mechanism having a first end connected to the rack and a second end provided with a mounting interface, the mounting interface being adapted for being mechanically connected to an electronic device, wherein a pivot connection is provided for connecting the mounting interface to the scissor mechanism; and
a latching mechanism, the latching mechanism having a latched condition in which a pivoting movement of the mounting interface in prevented, and a released condition in which the mounting interface is free to pivot around the pivot connection.

12. The rack of claim 11 wherein the latching mechanism has an abutment provided at a vertical post of the rack arranged at a forward side of the rack, and a pivotable latch arranged at a guide structure associated with the mounting interface.

13. The rack of claim 11 wherein a damper is provided for damping a movement of the mounting interface when it approaches a position of maximum pivot angle.

14. A rack for receiving electronic devices, having four vertical posts, a plurality of receiving slots, at least one of the receiving slots having two guide rails arranged on either side of the rack from a rear post to a forward post, the respective receiving slot having a scissor mechanism, the scissor mechanism having a first end connected to the rear posts, and a second end provided with a mounting interface adapted for a mechanical connection to a server or a measuring device, the mounting interface being associated with a guide structure to which a lower termination leg of the scissor mechanism is pivotally connected, the guide structure further having a guide slot in which an upper termination leg of the scissor mechanism is received, the guide slot having a vertical slot portion adapted for accommodating a vertical displacement of the upper termination leg occurring when the mounting interface is displaced from a rearward position to a forward position, the guide slot further having a curved portion whose centre of curvature coincides with the pivot axis defined by the connection between the lower termination leg of the scissor mechanism and the guide structure, a latching mechanism being provided which prevents the mounting interface from pivoting with respect to the scissor mechanism when in a latched condition.

* * * * *